United States Patent
Yoon

(10) Patent No.: US 7,829,881 B2
(45) Date of Patent: Nov. 9, 2010

(54) SEMICONDUCTOR LIGHT EMITTING DEVICE HAVING ROUGHNESS AND METHOD OF FABRICATING THE SAME

(75) Inventor: Ho Sang Yoon, Gwangju-si (KR)

(73) Assignee: LG Innotek Co., Ltd., Seoul (KR)

( * ) Notice: Subject to any disclaimer, the term of this patent is extended or adjusted under 35 U.S.C. 154(b) by 28 days.

(21) Appl. No.: 11/896,877

(22) Filed: Sep. 6, 2007

(65) Prior Publication Data

US 2008/0061308 A1   Mar. 13, 2008

(30) Foreign Application Priority Data

Sep. 7, 2006   (KR) .................. 10-2006-0086473

(51) Int. Cl.
| | |
|---|---|
| H01L 29/06 | (2006.01) |
| H01L 31/0328 | (2006.01) |
| H01L 31/0336 | (2006.01) |
| H01L 31/072 | (2006.01) |
| H01L 31/109 | (2006.01) |
| H01L 29/22 | (2006.01) |
| H01L 33/00 | (2006.01) |
| H01L 29/24 | (2006.01) |
| H01L 23/48 | (2006.01) |
| H01L 23/52 | (2006.01) |
| H01L 29/40 | (2006.01) |

(52) U.S. Cl. .................. 257/13; 257/21; 257/94; 257/101; 257/102; 257/103; 257/739; 257/E33.001; 257/E33.043; 257/E33.062; 257/E33.065; 257/E33.074; 257/E25.058

(58) Field of Classification Search .............. 257/13, 257/21, 94, 101–103, 739, E33.001, E33.043, 257/E33.062, E33.065, E33.074, E25.058
See application file for complete search history.

(56) References Cited

U.S. PATENT DOCUMENTS

| | | | | |
|---|---|---|---|---|
| 5,040,044 | A  * | 8/1991 | Noguchi et al. | 257/103 |
| 6,442,184 | B1 * | 8/2002 | Ota et al. | 372/43.01 |
| 6,504,180 | B1 * | 1/2003 | Heremans et al. | 257/98 |
| 6,623,998 | B2 * | 9/2003 | Shibata et al. | 438/22 |
| 6,900,473 | B2 * | 5/2005 | Yoshitake et al. | 257/95 |
| 7,049,638 | B2 * | 5/2006 | Wu et al. | 257/97 |
| 7,161,188 | B2 * | 1/2007 | Orita | 257/98 |
| 7,183,586 | B2 * | 2/2007 | Ichihara et al. | 257/98 |
| 7,244,957 | B2 * | 7/2007 | Nakajo et al. | 257/13 |
| 7,345,321 | B2 * | 3/2008 | Wu et al. | 257/99 |
| 7,385,226 | B2 * | 6/2008 | Ou et al. | 257/95 |
| 7,476,910 | B2 * | 1/2009 | Fujimoto et al. | 257/95 |
| 7,485,482 | B2 * | 2/2009 | Lee et al. | 438/29 |
| 7,615,798 | B2 * | 11/2009 | Sanga et al. | 257/99 |
| 2005/0082562 | A1 * | 4/2005 | Ou et al. | 257/103 |

(Continued)

FOREIGN PATENT DOCUMENTS

KR   10-0593941 B1   6/2006

(Continued)

*Primary Examiner*—Ida M Soward
(74) *Attorney, Agent, or Firm*—Birch, Stewart, Kolasch & Birch, LLP

(57) ABSTRACT

A semiconductor light emitting device including a first electrode contact layer, an active layer formed on the first electrode contact layer, a second electrode contact layer formed on the active layer, and a first roughness layer formed on at least one of the first and second electrode contact layers.

20 Claims, 6 Drawing Sheets

U.S. PATENT DOCUMENTS

| | | | |
|---|---|---|---|
| 2005/0173717 A1* | 8/2005 | Lee et al. ........................ | 257/98 |
| 2005/0236636 A1* | 10/2005 | Hon et al. ...................... | 257/99 |
| 2006/0175624 A1* | 8/2006 | Sharma et al. ................. | 257/94 |
| 2006/0261323 A1* | 11/2006 | Suh et al. ....................... | 257/13 |
| 2007/0018183 A1* | 1/2007 | Denbaars et al. .............. | 257/98 |
| 2007/0029541 A1* | 2/2007 | Xin et al. ....................... | 257/14 |
| 2007/0082418 A1* | 4/2007 | Wuu et al. ..................... | 438/22 |
| 2007/0267640 A1* | 11/2007 | Lee et al. ....................... | 257/94 |
| 2007/0267644 A1* | 11/2007 | Leem ............................. | 257/98 |
| 2008/0061307 A1* | 3/2008 | Ikeda et al. .................... | 257/94 |
| 2008/0087902 A1* | 4/2008 | Lee et al. ....................... | 257/88 |
| 2008/0157111 A1* | 7/2008 | Erchak et al. .................. | 257/98 |
| 2008/0283865 A1* | 11/2008 | Yoo et al. ...................... | 257/103 |

FOREIGN PATENT DOCUMENTS

KR   10-2006-0074387 A   7/2006

* cited by examiner

SEMICONDUCTOR LIGHT EMITTING DEVICE HAVING ROUGHNESS AND METHOD OF FABRICATING THE SAME

The present application claims priority under 35 U.S.C. 119 and 35 U.S.C. 365 to Korean Patent Application No. 10-2006-0086473 (filed on Sep. 7, 2006), which is hereby incorporated by reference in its entirety.

BACKGROUND

The embodiment relates to a semiconductor light emitting device and a method of fabricating the same.

A light emitting diode (LED) can emit light in various colors using characteristics of compound semiconductor materials such as GaAs, AlGaAs, GaN, InGaN, InGaAlP, and so on. The LED is packaged and used as a light source in various fields such as a lighting display, a character display, and an image display.

This LED is stacked with an N-type semiconductor layer, an active layer, and a P-type semiconductor layer. Thus, when the LED is supplied a power, the a light is generated from the active layer of the LED, and is emitted outsides

SUMMARY

An embodiment provides a semiconductor light emitting device and a method of fabricating the same, in which a roughness layer of a rod shape is formed on at least one of a first and second electrode contact layers, thereby improving the efficiency of emitting light to the outside.

The embodiment, a semiconductor light emitting device comprises a first electrode contact layer, an active layer on the first electrode contact layer, a second electrode contact layer on the active layer, and a first roughness layer on/under at least one of the first and second electrode contact layers.

The embodiment, a method of fabricating a semiconductor light emitting device comprises the steps of: forming a first electrode contact layer on a substrate; forming an active layer on the first electrode contact layer; forming a second electrode contact layer on the active layer; and forming a first roughness layer comprising a rod shape on the second electrode contact layer.

The embodiment, a method of fabricating a semiconductor light emitting device comprises the steps of: forming a semiconductor layer comprising a first electrode contact layer, an active layer, and a second electrode contact layer; forming a second electrode on one surface of the semiconductor layer; forming a conductive support substrate on the second electrode; and forming a roughness layer comprising a rod shape on other surface of the semiconductor layer.

DETAILED DESCRIPTION OF THE EMBODIMENTS

Hereinafter, a semiconductor light emitting device according to embodiments will be described in detail with reference to the accompanying drawings.

Figure 1:
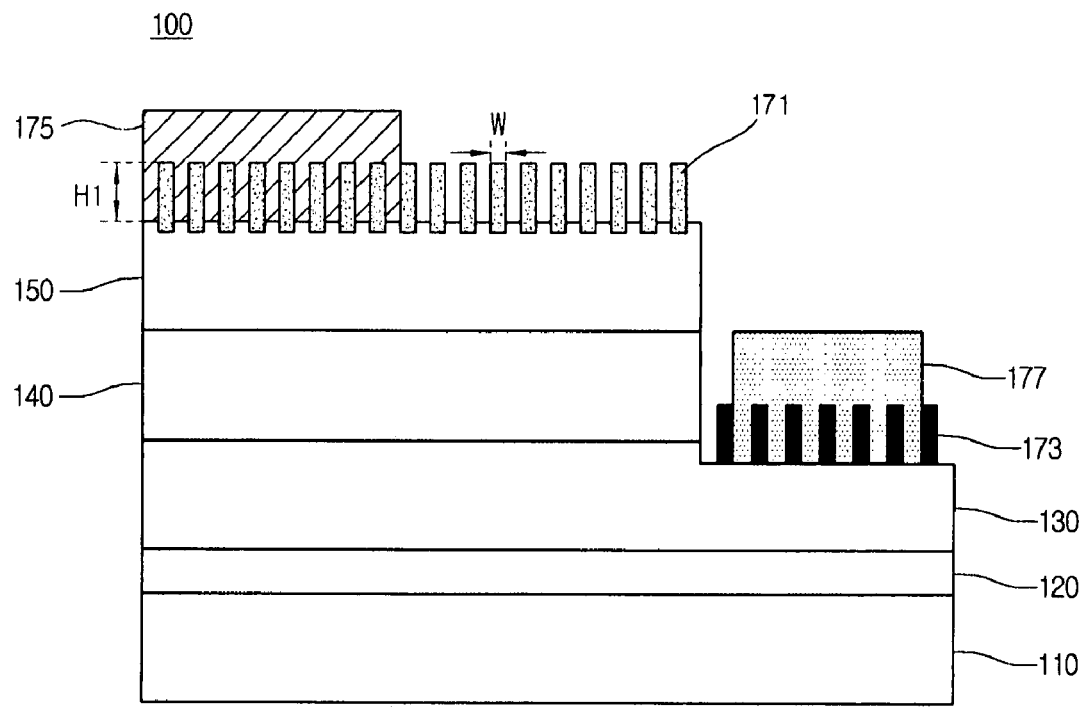
FIG. 1 is a side sectional view illustrating a semiconductor light emitting device according to a first embodiment.

FIG. 1 is a side sectional view illustrating a semiconductor light emitting device according to a first embodiment.

Referring to FIG. 1, the semiconductor light emitting device 100 comprises a substrate 110, a buffer layer 120, a first electrode contact layer 130, an active layer 140, a second electrode contact layer 150, a first roughness layer 171, a second electrode 175, a second roughness layer 173, and a first electrode 177.

The substrate 110 can be selected from the group consisting of sapphire ($Al_2O_3$), GaN, SiC, ZnO, Si, GaP and GaAs substrates, and can be removed before any electrode is formed.

The buffer layer 120 is formed on the substrate 110. The buffer layer 120 is formed of any one selected from GaN, InN, AlN, AlInN, InGaN, AlGaN and InAlGaN. The buffer layer 120 can be formed thereon with an undoped GaN layer (not shown). At this time, the buffer layer 120 and the undoped GaN layer can be selectively formed or removed.

The first electrode contact layer 130, for instance which is an N-type semiconductor layer, is formed on the buffer layer 120. The first electrode contact layer 130 can be formed of any one selected from nitride semiconductors such as GaN, InN, AlN, InGaN, AlGaN and InAlGaN. The first electrode contact layer 130 is selectively doped with an N-type dopant such as Si, Ge, Sn, Se and Te.

Here, the second roughness layer 173 is formed within an exposed region of the first electrode contact layer 130. The first electrode 177 is formed on the exposed region of the first electrode contact layer 130 as well as the second roughness layer 173.

The active layer 140 is formed on the first electrode contact layer 130. The active layer 140 can be formed in a single quantum well structure or in a multiple quantum well structure.

The second electrode contact layer 150, for instance which is a P-type semiconductor layer, is formed on the active layer 140. The second electrode contact layer 150 can be formed of any one selected from nitride semiconductor materials such as GaN, AlGaN, InGaN, and InAlGaN, and is selectively doped with a P-type dopant such as Mg, Be and Zn.

Here, an N-type clad layer (not shown) can be formed between the active layer 140 and the first electrode contact layer 130, while a P-type clad layer (not shown) can be formed between the active layer 140 and the second electrode contact layer 150.

The first roughness layer 171 is formed on the second electrode contact layer 150, and the second electrode 175 is formed on the second electrode contact layer 150 as well as the first roughness layer 171.

The first roughness layer 171 can be formed of a GaN semiconductor material, and the second electrode 175 can include a transparent electrode, which is formed of one of ITO, ZnO, RuOx, TiOx, and IrOx. The second electrode 175 can have at least one layer, which is formed of one of Ti, Au, Pd, Ni and the like.

Here, each of the first and second roughness layers 171 and 173 protrudes in an amorphous or hexagonal rod shape. Further, the amorphous or hexagonal rods constituting each of the first and second roughness layers 171 and 173 have different sizes at an irregular interval. Any one of the amorphous or hexagonal rods constituting the first roughness layer 171 has a height (or thickness) H1 from about 0.08 μm to about 0.25 μm with respect to the surface of the second electrode contact layer 150, and a width (or diameter) W from about 1 μm to about 1.4 μm.

Further, the first roughness layer 171 is formed of a nitride semiconductor material (e.g. GaN) into which neither the N-type dopant nor the P-type dopant is doped.

FIGS. 2 through 7 illustrate a process of fabricating a nitride semiconductor in accordance with a first embodiment.

Figure 2:
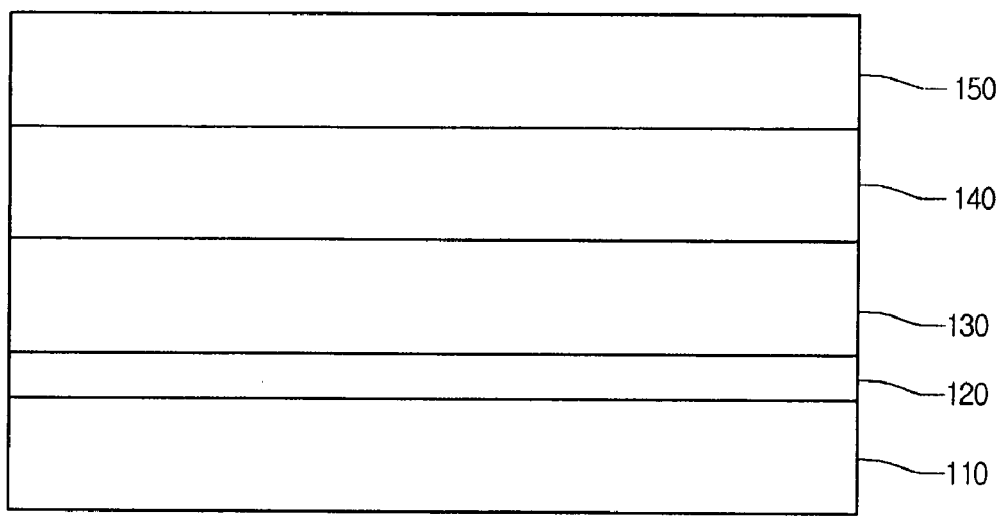
FIGS. 2 through 7 are views illustrating a process of fabricating a semiconductor light emitting device according to a first embodiment.

FIG. 2 is a sectional view illustrating a stacked structure of a nitride semiconductor light emitting device according to a first embodiment.

Referring to FIG. 2, the substrate 110 has the buffer layer 120, the first electrode contact layer 130, the active layer 140, and the second electrode contact layer 150 stacked thereon in that order. The first electrode contact layer 130, the active layer 140, and the second electrode contact layer 150 can be formed by a process such as metal organic chemical vapor deposition (MOCVD).

Here, the substrate 110 can be selected from the group consisting of sapphire ($Al_2O_3$), GaN, SiC, ZnO, Si, GaP and GaAs substrates. The buffer layer 120 is formed of any one selected from GaN, InN, AlN, AlInN, InGaN, AlGaN and InAlGaN. Alternatively, the buffer layer 120 may be not formed.

The first electrode contact layer 130 can have at least one nitride semiconductor layer, which is formed of any one selected from GaN, InN, AlN, InGaN, AlGaN and InAlGaN, and into which an N-type dopant is doped. Here, the N-type dopant includes a conductive dopant such as Si, Ge, Sn, Se and Te.

The active layer 140 can be formed in a single quantum well structure or in a multiple quantum well structure. The active layer 140 can be formed in the quantum well structure of a semiconductor material layer, for example a GaN/InGaN layer, having a chemical formula of $In_XAl_YGa_{1-X-Y}N(0 \leq X, 0 \leq Y, and\ X+Y \leq 1)$.

The second electrode contact layer 150 can have at least one nitride semiconductor layer, which is formed of any one selected from GaN, AlGaN, InGaN, and InAlGaN, and into which a P-type dopant is doped. Here, the P-type dopant includes a conductive dopant such as Mg, Be and Zn. The second electrode contact layer 150 includes a semiconductor layer, which is doped with the P-type dopant and has weak Mg—H bonds due to a small quantity of Ga.

At this time, the growth of the second electrode contact layer 150 is carried out by supplying atmospheric gas ($H_2, N_2, NH_3$) and source gas of TMGa (or TEGa) or Cp2Mg at a predetermined temperature from about 800° C. to about 1000° C. Further, a growth time can be set to a range from about 10 sec to about 180 sec. Here, the atmospheric gas can use a mixture of $H_2$ and $NH_3$, or only $NH_3$. A quantity doped with the Cp2Mg source gas for magnesium (Mg) is five times or more of that supplied to the existing P-type semiconductor layer. Further, a quantity supplied with the TMGa or TEGa source gas for gallium (Ga) is about one fifth of that supplied to the existing P-type semiconductor layer. For example, if the quantities of Mg and Ga supplied to the existing P-type semiconductor layer amount to 1 μmol/min and 100 μmol/min, the quantities of Mg and Ga supplied to the second electrode contact layer 150 of the embodiment can amount to at least 5 μmol/min and 20 μmol/min.

Figure 3:
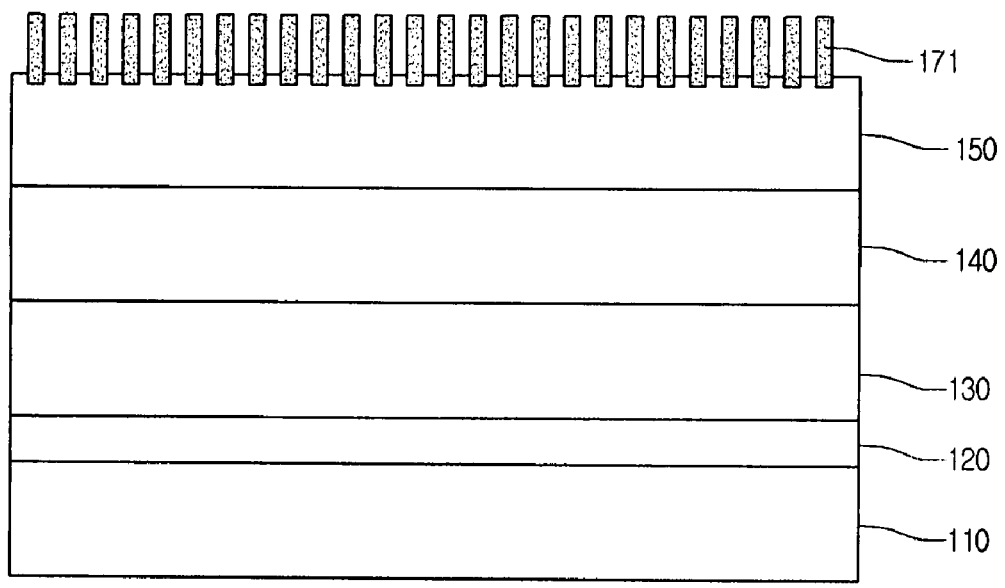
Figure 4:
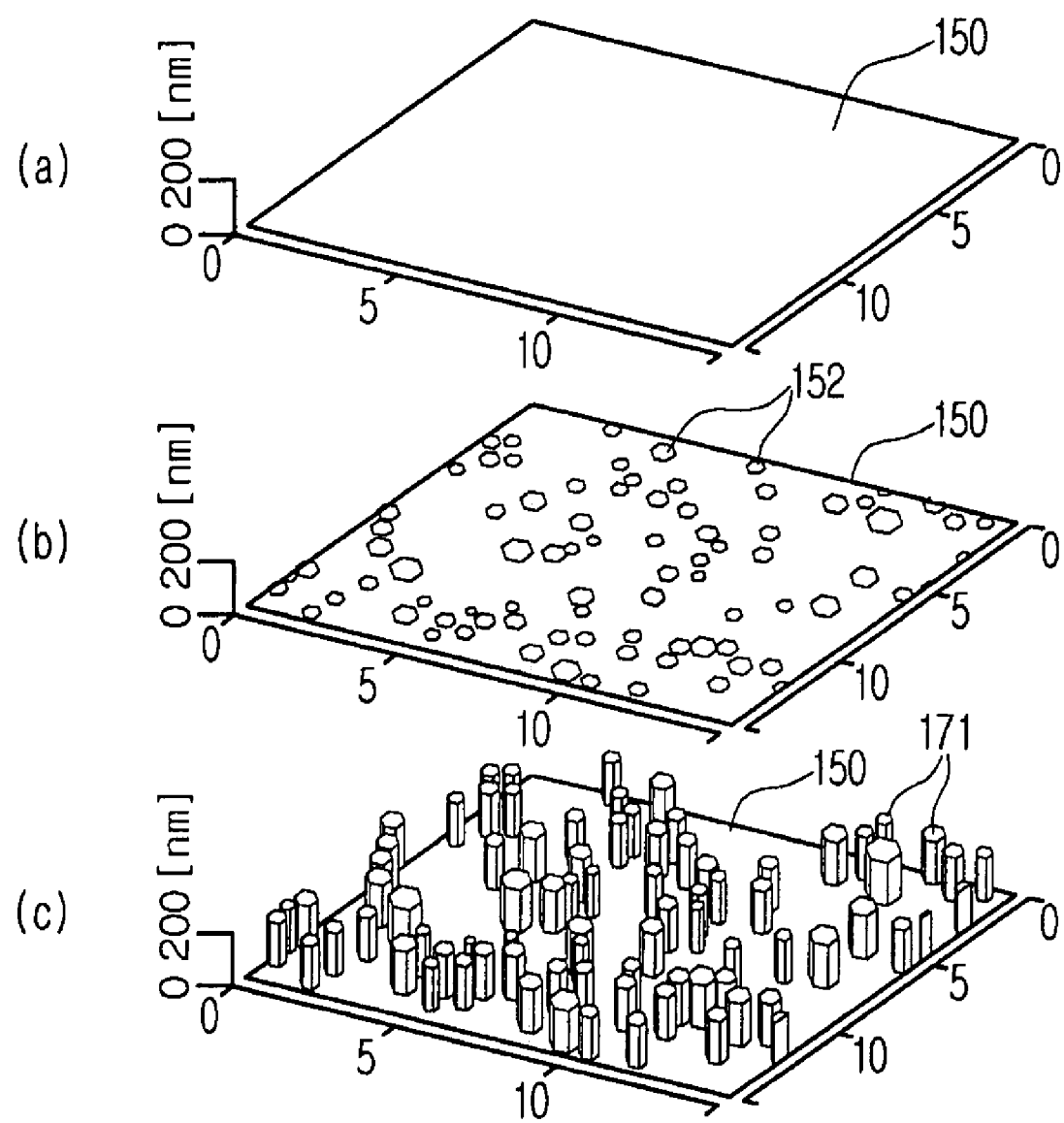
Figure 5:
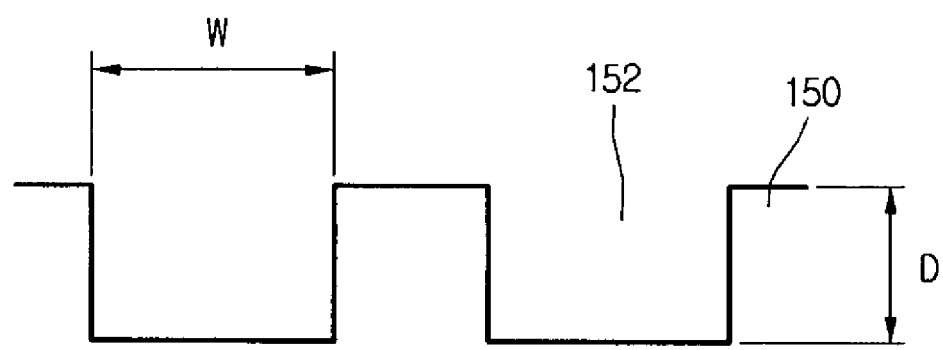
Figure 5:
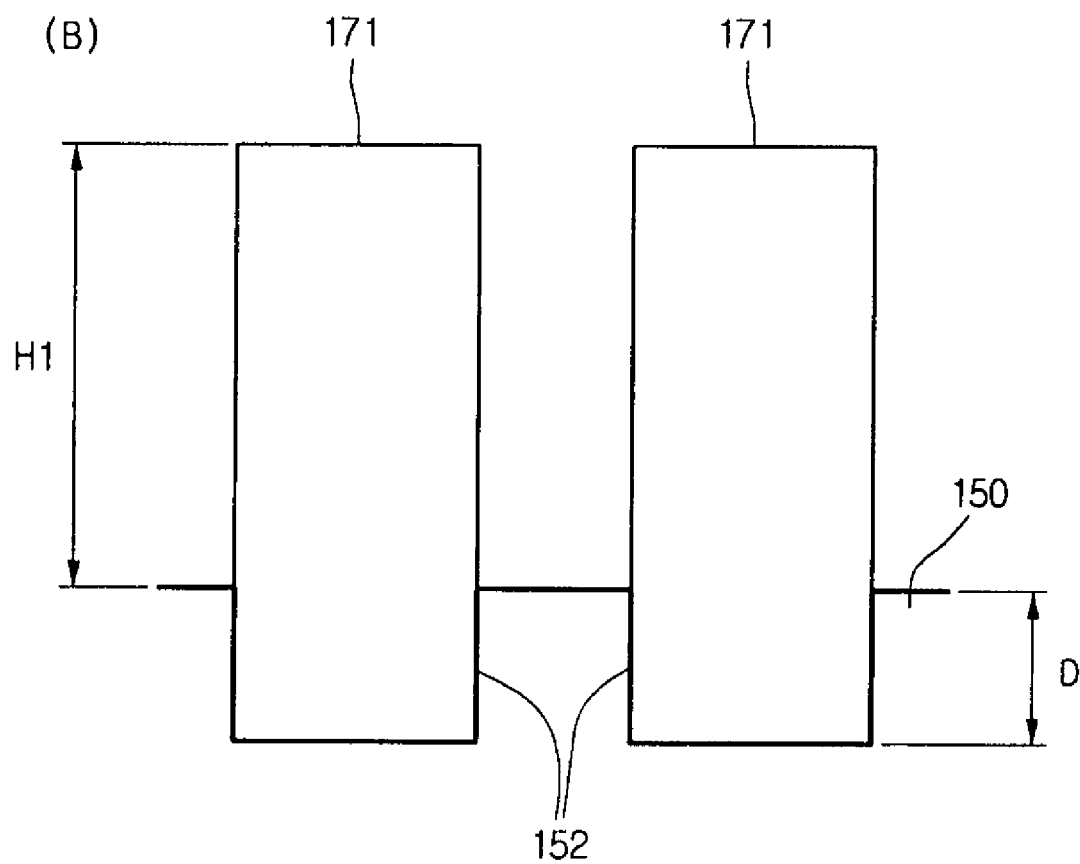

FIG. 3 is a sectional view illustrating an example of forming a first roughness layer on a second electrode contact layer in accordance with a first embodiment. FIGS. 4(A), 4(B) and 4(C) are views illustrating a process of forming the first roughness layer on the second electrode contact layer of FIG. 3. FIG. 5 is a detailed view illustrating roughness recesses and the first roughness layer of FIG. 4.

Referring to FIG. 3, after the second electrode contact layer 150 is formed, the first roughness layer 171, which is formed of GaN and into which a P-type dopant is not doped, is formed on the second electrode contact layer 150.

Referring to FIGS. 4(A) and 4(B), the second electrode contact layer 150 is subjected to hydrogen annealing at a high temperature (from about 800° C. to about 1050° C.) for growth. At this time, the weak Mg—H bonds of the second electrode contact layer 150 are broken, so that roughness recesses 152 are formed at a predetermined depth. In this case, the second electrode contact layer 150 functions as a seed layer, in which the non-uniform Mg—H bonds are broken to form the roughness recesses 152 having a predetermined depth. The roughness recesses 152 are irregularly formed with different sizes.

Then, the second electrode contact layer 150 having the roughness recesses 152 is not supplied with an Mg source, and is subjected to rapid growth using only a Ga source. Thus, the second electrode contact layer 150 is subjected to GaN growth from the roughness recesses 152, activation energy of which is relatively high. As in FIG. 4(C), the GaN growth from the roughness recesses 152 results in formation of the amorphous or hexagonal rods of the first roughness layer 171. Here, the growth temperature for forming the first roughness layer 171 can be set to be higher than the growth temperature of the second electrode contact layer 150. The first roughness layer 171 has at least ten times as fast growth rate as the existing P-type semiconductor layer has, and thus it can be formed at a thickness (e.g. maximum 0.3 μm) that is at least ten times of that of the existing P-type semiconductor layer for the same time.

In detail, the first roughness layer 171 can be formed, because the Mg, which is doped excessively onto the second electrode contact layer 150, comes out in a growth direction, and then is bonded to GaN in the form of $Mg^+$ that results from the breakdown of each Mg—H bond. Hence, the first roughness layer 171 can be a GaN layer having good cystallinity and carrier concentration, compared to the existing P-type semiconductor layer.

Referring to FIG. 5(A), each roughness recess 152 formed in the second electrode contact layer 150 has a depth D from about 5 nm to about 50 nm, and a width W from about 1 μm to about 1.4 μm.

Referring to FIG. 5(B), the amorphous or hexagonal rods of the first roughness layer 171 are formed at a predetermined height H1 with respect to the surface of the second electrode contact layer 150. The height H1 ranges from about 0.08 μm to about 0.25 μm. Further, each amorphous or hexagonal rod of the first roughness layer 171 can be formed with the same width (i.e. from about 1 μm to about 1.4 μm) or shape as each roughness recess.

Figure 6:
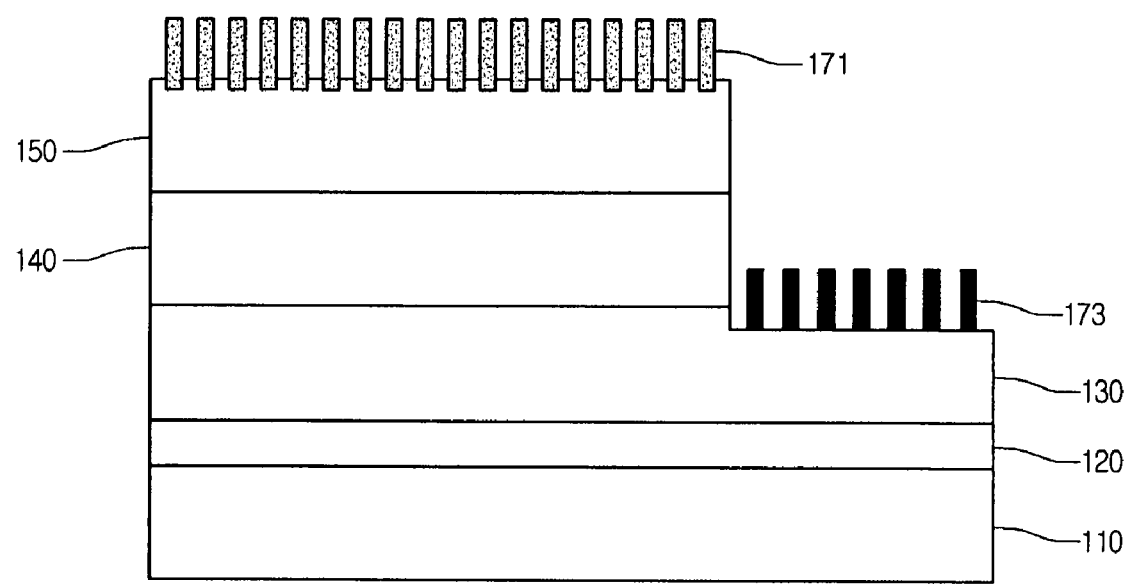

FIG. 6 is a sectional view illustrating an example where etching is performed from the second electrode contact layer 150 to part of the first electrode contact layer 130 in accordance with a first embodiment.

Referring to FIG. 6, an etching process is performed from part of the second electrode contact layer 150 to part of the first electrode contact layer 130. At this time, the etching can make use of dry etching such as inductively coupled plasma (ICP) etching. When this dry etching is performed, a crystalline difference between the first roughness layer 171 and the second electrode contact layer 150 causes a difference between an etched depth of the first roughness layer 171 and an etched depth of the second electrode contact layer 150. Further, when the etching is performed until the first electrode contact layer 130 is exposed, the second roughness layer 173 is formed on the first electrode contact layer 130 by the first roughness layer 171.

More specifically, the first roughness layer 171 having high crystallinity is more slowly etched, compared to the second electrode contact layer 150 that is etched normally. Hence, when the etching is performed to expose the part of the first electrode contact layer 130, the second roughness layer 173 is left by the first roughness layer 171. In this manner, the second roughness layer 173 can be formed using the first roughness layer 171 rather than a separate mask. Further, the efficiency of emitting light to the outside can be improved by the first and second roughness layers 171 and 173 formed on the second and first electrode contact layers 150 and 130.

The thickness of the second roughness layer 173 can be varied by an etching time, etching power, and so on.

Figure 7:
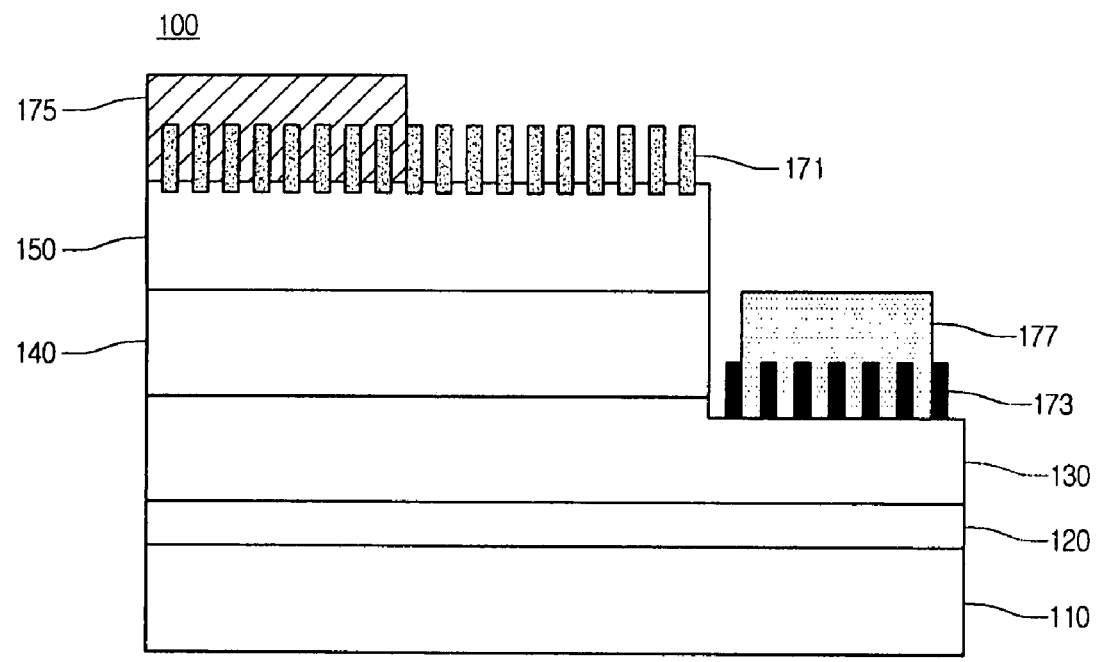

Referring to FIG. 7, the second electrode 175 is formed on the second electrode contact layer 150, and the first electrode 177 is formed on the exposed first electrode contact layer 130. At this time, the second electrode 175 is formed on the second electrode contact layer 150 in cooperation with the first roughness layer 171, and the first electrode 177 is formed on the exposed first electrode contact layer 130 in cooperation with the second roughness layer 173. Here, the second electrode 175 can include a transparent electrode, which is formed of one of ITO, ZnO, RuOx, TiOx, and IrOx. The second electrode 175 can have at least one layer, which is formed of one of Ti, Au, Pd, Ni and the like.

Figure 8:
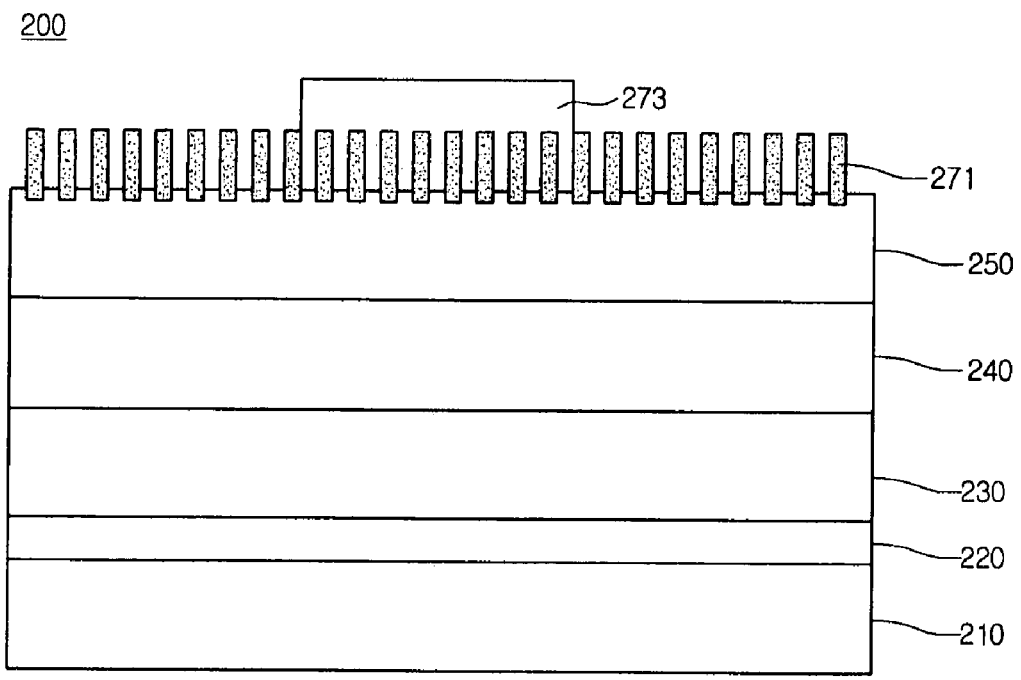
FIG. 8 is a side sectional view illustrating a semiconductor light emitting device according to a second embodiment.

FIG. 8 is a side sectional view illustrating a semiconductor light emitting device according to a second embodiment.

Referring to FIG. 8, the semiconductor light emitting device 200 can be implemented as a vertical semiconductor light emitting device. This semiconductor light emitting device 200 comprises a conductive support substrate 210, a second electrode 220, and a second electrode contact layer 230; an active layer 240, a first electrode contact layer 250, and a first electrode 273; and a roughness layer 271.

The conductive support substrate 210 functions as a base support layer. The second electrode 220 is formed on the conductive support substrate 210. The second electrode 220 can be implemented as a P-type electrode that makes ohmic contact. The P-type electrode can include at least one layer, which is formed of any one selected from the group consisting of Ag, Ni, Al, Rh, Pd, Ir, Ru, Mg, Zn, Pt, Au, Hf, and a combination thereof. This second electrode 220 can be implemented as a reflective electrode, and a reflective layer (not shown) can be formed between the conductive support substrate 210 and the second electrode 220 or between the second electrode contact layer 230 and the second electrode 220. Further, the second electrode 220 and the conductive support substrate 210 can have a conductive adhesive layer (not shown). Thus, the conductive adhesive layer can adhere the second electrode 220 and the conductive support substrate 210.

The second electrode contact layer 230 is formed on the second electrode 220, and the active layer 240 is formed on the second electrode contact layer 230. The first electrode contact layer 250 is formed on the active layer 240. At least one of a buffer layer and an undoped semiconductor layer can be removed on the first electrode contact layer 250.

Here, the first electrode contact layer 250 can be implemented as an N-type semiconductor layer, whereas the second electrode contact layer 230 can be implemented as a P-type semiconductor layer. Alternatively, the first electrode contact layer 250 may be implemented as a P-type semiconductor layer, whereas the second electrode contact layer 230 may be implemented as an N-type semiconductor layer.

The roughness layer 271 is formed on the first electrode contact layer 250. The roughness layer 271 can be formed in an amorphous or hexagonal rod shape. The first electrode 273 is formed on the first electrode contact layer 250 corresponding to a predetermined region of the roughness layer 271. Here, when the first electrode contact layer 250 is the N-type semiconductor layer, the roughness layer 271 can be formed of a nitride semiconductor material into which an N-type (or P-type) dopant is not doped.

In the vertical semiconductor light emitting device 200, the first electrode contact layer 250, the active layer 240, the second electrode contact layer 230, the second electrode 220, and the conductive support substrate 210 are formed on a substrate (not shown) in that order, and then the substrate (not shown) is removed by a physical or chemical removal method, for instance a laser lift off (LLO) method. Next, the conductive support substrate 210 is positioned on a base, and then the roughness layer 271 and the first electrode 273 are formed on the second electrode contact layer 250.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device, comprising:
a first semiconductor layer;
an active layer on the first semiconductor layer;
a second semiconductor layer on the active layer, the second semiconductor having an upper surface and a plurality of recesses formed in the upper surface of the second semiconductor layer; and
a plurality of first rods protruding from the plurality of recesses to a height higher than the upper surface of the second semiconductor layer.

2. The semiconductor light emitting device as claimed in claim 1, wherein a rod of the plurality of first rods has any one of an amorphous rod shape, an irregular shape and a hexagonal rod shape.

3. The semiconductor light emitting device as claimed in claim 1, wherein the plurality of first rods has a height from about 0.08 µm to about 0.25 µm with respect to an upper surface of the second semiconductor layer, and a width from about 1 µm to about 1.4 µm.

4. The semiconductor light emitting device as claimed in claim 1, wherein one of the first and second semiconductor layers comprises at least one of GaN, InGaN, InN, AlN, AlGaN, and InAlGaN.

5. The semiconductor light emitting device as claimed in claim 1, comprising at least one of an undoped semiconductor layer, a buffer layer, and a substrate that are under the first semiconductor layer.

6. The semiconductor light emitting device as claimed in claim 1, wherein the plurality of first rods comprises a nitride semiconductor layer into which neither N-type dopant nor P-type dopant is doped.

7. The semiconductor light emitting device as claimed in claim 1, wherein the first semiconductor layer comprises an N-type nitride semiconductor layer or a P-type nitride semiconductor layer.

8. The semiconductor light emitting device as claimed in claim 1, comprising a first electrode under the first semiconductor layer,
wherein the first electrode comprises at least one of a reflective electrode layer, a reflective layer, a conductive adhesive layer, and a conductive support substrate.

9. The semiconductor light emitting device as claimed in claim 1, wherein the recesses have a depth from 5 nm to 50 nm with respect to the upper surface of the second semiconductor layer.

10. The semiconductor light emitting device as claimed in claim 1, wherein the recesses are irregularly formed with different sizes.

11. The semiconductor light emitting device as claimed in claim 1, further comprising:
a second electrode formed on the second semiconductor layer,
wherein at least one of the plurality of first rods is embedded into the second electrode, and
wherein the second electrode is formed of one of ITO, ZnO, RuOx, TiOx, IrOx, Ti, Au, Pd, or Ni.

12. The semiconductor light emitting device as claimed in claim 1, further comprising:
a second electrode formed on the second semiconductor layer,
a lower surface of the second electrode is in contact with at least one of the plurality of first rods.

13. The semiconductor light emitting device as claimed in claim 1, further comprising:
a plurality of second rods protruding from an upper surface of the first semiconductor layer.

14. The semiconductor light emitting device as claimed in claim 13, further comprising:
a first electrode formed on the first semiconductor layer,
wherein at least one of the plurality of second rods is embedded into the first electrode.

15. A semiconductor light emitting device having roughness, comprising:
a first semiconductor layer including a first conductive type dopant;
an active layer on the first semiconductor layer;
a second semiconductor layer including a first conductive type dopant on the active layer;
a plurality of recesses formed in an upper surface of the first semiconductor layer or at a position lower than an upper surface of the second semiconductor layer; and
a plurality of first rods protruding from the plurality of recesses to a height higher than the upper surface of the first semiconductor layer or higher than the upper surface of the second semiconductor layer.

16. The semiconductor light emitting device as claimed in claim 15, further comprising:
a plurality of second rods protruding from the upper surface the first semiconductor layer, wherein the first and second plurality of rods are formed in an plurality of amorphous rod shapes or hexagonal rod shapes spaced apart from each other.

17. The semiconductor light emitting device as claimed in claim 15, further comprising:
at least one of a reflective electrode layer, a reflective layer, a conductive adhesive layer, and a conductive support substrate under the first semiconductor layer,
wherein the the plurality of first rods is formed on the second semiconductor layer which is an N-type semiconductor layer.

18. A semiconductor light emitting device, comprising:
a first semiconductor layer;
an active layer on the first semiconductor layer;
a second semiconductor layer on the active layer; and
a plurality of recesses formed in an upper surface of the second semiconductor layer;
a plurality of first rods protruding from the recesses to a height higher than an upper surface of the second semiconductor layer; and
a plurality of second rods protruding from an upper surface of the first semiconductor layer,
wherein the plurality of first rods is formed with a different dopant concentration than the first semiconductor layer or the second semiconductor layer.

19. The semiconductor light emitting device as claimed in claim 18, wherein the plurality of first rods is formed on the second semiconductor layer into which a P-type dopant is doped, and the plurality of first rods comprises a nitride semiconductor into which a P-type dopant is not doped.

20. The semiconductor light emitting device as claimed in claim 18,
wherein the plurality of first rods is formed on the second semiconductor layer into which an N-type dopant is doped.

* * * * *